United States Patent [19]

Kornbau et al.

[11] 4,388,388

[45] Jun. 14, 1983

[54] METHOD OF FORMING METALLIC PATTERNS ON CURVED SURFACES

[75] Inventors: Thomas W. Kornbau, Poway; Robert A. Sievers, Escondido, both of Calif.

[73] Assignee: General Dynamics Electronics Division, San Diego, Calif.

[21] Appl. No.: 270,338

[22] Filed: Jun. 4, 1981

[51] Int. Cl.$^3$ .................. G03C 5/00; H01Q 1/28; H01Q 1/40

[52] U.S. Cl. .................. 430/258; 430/313; 430/319; 430/323; 430/5; 343/909; 343/708; 343/873

[58] Field of Search ............ 343/909, 705, 708, 873; 430/313, 5, 314, 295, 319, 320, 323, 258

[56] References Cited

U.S. PATENT DOCUMENTS

| | | | |
|---|---|---|---|
| 3,052,042 | 9/1962 | Feder | 430/320 |
| 3,201,238 | 8/1965 | Dwyer | 430/314 |
| 3,649,394 | 3/1972 | Erickson, Jr. | 430/320 |
| 3,907,565 | 9/1975 | Burton et al. | 430/314 |
| 3,975,738 | 8/1976 | Pelton et al. | 343/872 |

Primary Examiner—Mary F. Downey
Attorney, Agent, or Firm—Brown & Martin

[57] ABSTRACT

A method of forming metallic patterns on a dielectric surface such as a radome surface that has a compound curve which includes the steps of coating the radome with a metal and then with a photoresist. An electrical pattern is formed on the photographic emulsion of a thin membrane that is used as a photo mask. A water soluble adhesive, which is non degradable to the exposure and development of the photoresist and the etching of the conductive surface is applied to the metallic surface and the photo mask is pressed into position on the adhesive to conform to the curvature of the radome. The photo mask is removed and the electrical pattern is provided on the surface by conventional developing and etching techniques to provide a clear, well defined pattern even in arrays wherein the pattern segments are of small dimension.

7 Claims, 8 Drawing Figures

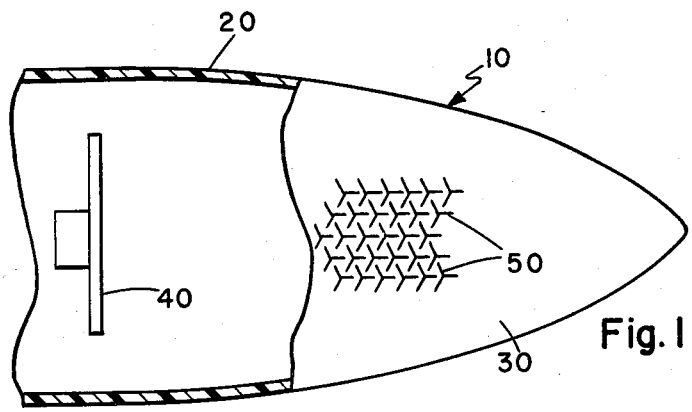
Fig. 1
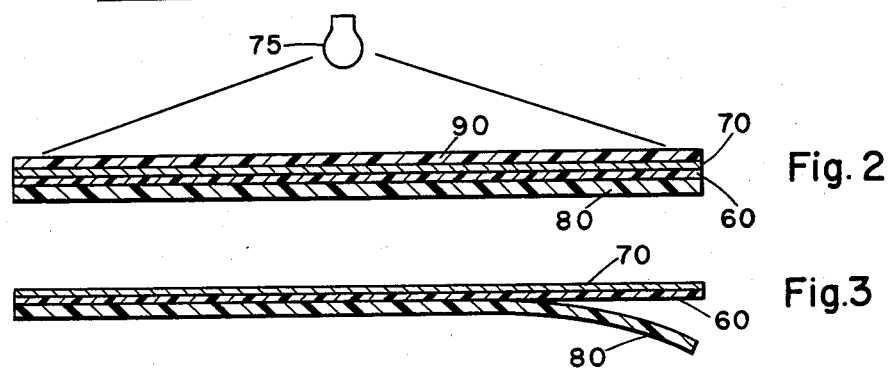
Fig. 2
Fig. 3
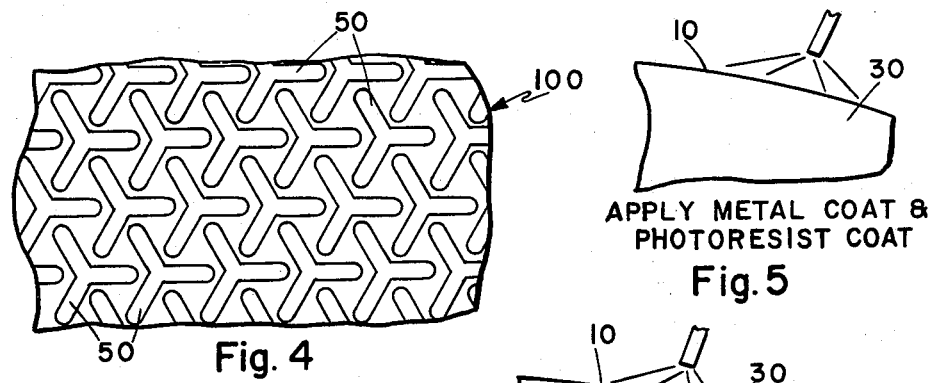
Fig. 4
APPLY METAL COAT & PHOTORESIST COAT
Fig. 5
APPLY ADHESIVE
Fig. 6
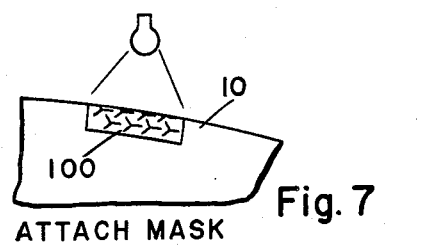
ATTACH MASK & EXPOSE
Fig. 7
REMOVE MASK, DEVELOP & ETCH
Fig. 8

METHOD OF FORMING METALLIC PATTERNS ON CURVED SURFACES

The United States Government has rights in this invention, pursuant to contracts with the United States Government.

The invention relates generally to a method of forming electrical patterns in a surface having compound curvature and is particularly useful in forming patterns in radomes used in high speed aircraft for improving directional accuracy and integrity of radar signals.

BACKGROUND OF THE INVENTION

Airborne vehicles such as high speed aircraft, for example, have their electrical equipment covered by a radome which provides mechanical protection for the equipment and is configured to complement the aerodynamic streamlining of the vehicle. Typically, the antenna system for transmitting and receiving RF energy is mounted in the radome and is actuated to provide mechanical or electronic scanning and rotating of azimuth and elevation angles relative to the vehicle axis. The radome is preferably made of a dielectric material.

One type of radome includes a slot pattern or array in a conductive material on the radome. The slot pattern is positioned and configured with respect to the antenna to match the antenna and maximize the accuracy and directional effect of the transmitted and received signals. This slot pattern must be clearly defined and precisely positioned to obtain the desired results.

The compound curvature resulting from the aerodynamic and electrical requirements of the radome provides a problem in the establishment of the slot array, particularly with slots of very small size. Conventional approaches either place the slot pattern in a flat surface or form the radome of metal with slots formed in the metal. A metal radome shell is thin and therefore difficult to make and handle. Such radome shells may be reinforced after forming with a thin sheet of dielectric material such as fiberglass cloth laminated with epoxy resin. Prior attempts to locate the slots on an arbitrary preformed curved surface have been unsuccessful.

There are various ways to form radar slots on a flat surface such as masked spraying or laminating, for example. These techniques have not proven satisfactory with a surface having a compound curvature. Even a surface with a single curvature cannot be handled effectively with conventional techniques because it is necessary to provide well defined, complete, sharp patterns to obtain the proper electrical characteristics for the radar signal. This is particularly true with slots which are in the dimension range of millimeters.

SUMMARY OF THE INVENTION

The method of the present invention overcomes the deficiencies of the prior art by photographically forming a pattern such as a radar antenna slot pattern on a photo mask, formed by a stripping film composed of a thin, flexible membrane with a photographic emulsion on it. The radome shell, formed of a dielectric material, is coated with a conductive metal and then with a photoresist. A water soluble adhesive is applied to the metallic surface. The radome surface with the photo mask in place on the adhesive is exposed to ultraviolet light and the slot pattern is established. The water soluble adhesive will not affect the subsequent developing process when the photoresist is developed and a portion of the metallic surface is etched away to form the slot pattern. The thin stripping film membrane permits the photo mask to conform to a compound curvature without destructive wrinkling. The method accurately and completely defines a sharp pattern such as a radar antenna slot pattern.

DESCRIPTION OF THE DRAWINGS

FIG. 1 is a side elevation view of a radome partly sectioned and showing a partial array of slots formed in the conductive surface of the radome.

FIG. 2 is an enlarged cross section of the photo mask demonstrating the steps of exposing the photo mask and developing it to form the slot pattern.

FIG. 3 is a similar cross section showing the step of removing the backing strip from the photo mask after the slot pattern has been established in the photo mask.

FIG. 4 is an enlarged view of the photo mask surface showing the slots formed in the photo mask.

FIG. 5 is a schematic view demonstrating the steps of coating the metal with a photoresist.

FIG. 6 is a schematic view and demonstrates the step of applying a water soluble adhesive to the photoresist on the radome surface.

FIG. 7 is a partial view of the radome demonstrating a photo mask set in place on the adhesive and the exposing of the photoresist to ultra violet light through the photo mask.

FIG. 8 is a partial view of a radome demonstrating the step of removing the photo mask, developing the photoresist, and etching away that portion of the metal which has not been fixed by the photoresist.

DETAILED DESCRIPTION OF THE INVENTION

Referring to the drawings, a radome of the type used in high speed aircraft is shown at 10. The radome is formed of a dielectric material such as a suitable plastic 20, and is coated with a metal such as copper or aluminum 30. The radome 10 houses an antenna 40 which is mounted or gimbaled to sweep a desired pattern. An array of openings or slots 50 is formed in the metal coating 30 to provide the electrical characteristics of a resonant radome.

The slots 50 must be accurately located and clearly defined to pass the transmitted signal from the antenna and the received tracking signal. The method of the present invention permits the use of a preformed dielectric radome which is then coated with metal to provide a conductive surface.

FIG. 2 of the drawings shows a stripping film comprising a base 60 formed of a flexible membrane with a photographic emulsion 70 on one surface and a removable backing strip 80 affixed to the other surface. A photographic negative 90 is positioned in contact with the emulsion 70 of the stripping film. This view of the drawing demonstrates the exposure of the emulsion 70 on the stripping film to a light source 75 through the negative 90. The stripping film is then developed to provide the required slot pattern in the film. This results in a photo mask 100. The backing strip 80 is removed from the photo mask and the photo mask is ready for use.

In order to permit the photo mask to conform to a compound curve surface when applied, the membrane must be thin. A suitable stripping film is stripping film TS5, produced by Minnesota Mining and Manufacturing Company, which is on the order of ½ thousandth inch thick. If the base is too thick, it will not conform to the radome curvature. If it is too thin, it is extremely difficult to handle. The backing strip 80, is polyester and is on the order of four thousandths inch thick. Several photo masks are used in providing an array which covers the entire surface of the radome. The size of the particular mask depends upon the curvature of the radome, and in instances where the curvature is rather severe, a 3 inch square mask was necessary to avoid creating unacceptable distortion in the slot patterns. The photo mask must be of a size that avoids wrinkling when it is conformed to the curved surface.

The stripping film shown in FIG. 3 of the drawing has been created with the slot pattern shown in FIG. 1 formed in the emulsion 70 by well known photographic processes which makes the stripping film into a photo mask with a negative representation of the slot pattern shown in FIG. 1 of the drawing. After the emulsion 70 is photographically developed with the desired pattern, the backing strip 80 is removed as shown in FIG. 3 of the drawings. The metal coating 30 is then applied to the dielectric radome shell by a suitable process such as flame spraying or electro-plating, as shown in FIG. 5 of the drawings. Next, a photoresist is applied over the metal coating, as demonstrated in FIG. 5. A water soluble adhesive is then applied to the radome surface 30, as demonstrated in FIG. 6 of the drawing. This adhesive is applied in a thin layer and must not affect exposure of the photoresist and subsequent etching of the metal which has not been fixed by the photoresist. A suitable adhesive which has been used, is stripping adhesive gelatin 74-0400-5580-3 that is available from Minnesota Mining and Manufacturing Company.

The photo mask 100 is then pressed against the adhesive on the radome as shown in FIG. 7 of the drawing. The assembly is exposed to ultraviolet light to fix the pattern on the photoresist. The photo mask 100 is removed from the radome surface; the photoresist is developed; and the radome is processed with etching solution so that the electrical slots are formed in the proper pattern on the metal surface as the metal is etched away from the slot patterns. The number of photo masks used and their size depends upon the slot array and the curvature of the radome surface.

Because of the thin nature of the photo mask membrane, it will conform to the compound curve surface of the radome without significant distortion. If the mask does not closely conform to the radome surface without wrinkling, the slot pattern is distorted. Some slots may be well defined while some may be incompletely defined and others may have an in-between characteristic. This results in phase distortion and frequency shifting of the transmitted and received signals. If the slots do not electrically match the antenna, there is either no signal or a distorted signal which renders the radar ineffective. The geometry of the slot pattern is critical and the slots must be in well defined, sharp patterns.

Similarly, this method can be used to make permanent, reusable artwork. One approach is to deposit an opaque metal coating on the inside of a clear dome which passes ultraviolet light and which has the same shape as the outside of the radome. The photoresist and stripping film can be applied as before, and the negative of the image to be produced on the radome is etched into the clear dome. This dome is, then, the permanent reusable artwork. The dome is placed over a radome which has been coated with photoresist and a vacuum applied to provide contact between the inner surface of the clear dome and the outer surface of the radome. The exposure and etching would be as described above.

While the invention has been described relative to slot patterns, it will be understood by those skilled in the art, that strip patterns and circuit configurations can also be created with this method.

Having thus described our invention we claim:

1. The method of providing an electrical pattern on an element with a curved surface of dielectric material comprising the steps of;

coating said surface with a metal;

coating said metal with a photoresist;

forming a pattern in the emulsion of a stripping film that includes an emulsion on a thin membrane of flexible material having a thickness on the order of about one-half thousandth inch;

applying a thin layer of water soluble adhesive on said photoresist, said adhesive being non degradable to a subsequent process of exposing and developing the photoresist and etching away portions of said metal;

pressing said membrane against said adhesive in close engagement with the surface to conform said membrane to said curved surface;

exposing said membrane to a source of ultraviolet light to fix the pattern on said photoresist;

removing said membrane from said curved surface; and developing said photoresist and etching away that portion of the conductive surface that has not been fixed with said photoresist;

said method providing a sharp, clearly defined pattern in said curved surface.

2. The method according to claim 1 wherein said curved surface includes a compound curvature.

3. The method according to claim 1 wherein the adhesive is a gel.

4. The method according to claims 1 or 2 wherein the element is a radome for airborne vehicles.

5. The method according to claim 1 wherein the membrane includes a backing strip and the backing strip is removed after the pattern is fixed in the emulsion on said membrane.

6. The method according to claim 4 wherein the pattern is a slot pattern for radiating energy from a radar antenna and receiving tracking signals.

7. The method according to claim 1 wherein a mask is formed that comprises a plurality of said membranes, each membrane being of a size to accommodate the curvature of the surface to which it is applied without destructive wrinkling.

* * * * *